United States Patent
Berkovitch et al.

(10) Patent No.: US 12,399,199 B2
(45) Date of Patent: Aug. 26, 2025

(54) GRID MONITORING

(71) Applicant: Solaredge Technologies Ltd., Herzeliya (IL)

(72) Inventors: Nadav Berkovitch, Petah Tikva (IL); Moti Bitter, Ramat HaSharon (IL); Lior Heller, Jerusalem (IL)

(73) Assignee: Solaredge Technologies Ltd., Herzeliya (IL)

( * ) Notice: Subject to any disclaimer, the term of this patent is extended or adjusted under 35 U.S.C. 154(b) by 376 days.

(21) Appl. No.: 17/947,540

(22) Filed: Sep. 19, 2022

(65) Prior Publication Data

US 2023/0103006 A1    Mar. 30, 2023

Related U.S. Application Data

(60) Provisional application No. 63/246,514, filed on Sep. 21, 2021.

(51) Int. Cl.
| | | |
|---|---|---|
| *G05B 13/02* | (2006.01) | |
| *G01R 19/25* | (2006.01) | |
| *H02J 3/38* | (2006.01) | |
| *H02M 1/36* | (2007.01) | |

(52) U.S. Cl.
CPC ....... *G01R 19/2513* (2013.01); *G05B 13/024* (2013.01); *H02J 3/381* (2013.01); *H02M 1/36* (2013.01); *H02J 2300/24* (2020.01)

(58) Field of Classification Search
CPC ... G01R 19/2513; G05B 13/024; H02J 3/381; H02J 2300/24; H02M 1/36
See application file for complete search history.

(56) References Cited

U.S. PATENT DOCUMENTS

| 9,459,310 B2 | 10/2016 | Inzunza Figueroa et al. |
| 9,973,002 B2 | 5/2018 | Lazaris |
| 10,205,417 B2 | 2/2019 | Chapman et al. |

(Continued)

FOREIGN PATENT DOCUMENTS

| EP | 2941824 B1 | 11/2015 |
| EP | 3252910 B1 | 7/2020 |
| JP | 2011135768 A | 7/2011 |

OTHER PUBLICATIONS

Feb. 21, 2023—Extended European Search Report—EP App. No. 22196957.9.

(Continued)

*Primary Examiner* — Gary Collins
(74) *Attorney, Agent, or Firm* — Banner & Witcoff, Ltd.

(57) ABSTRACT

Methods are described for monitoring a power grid at an output of a power converter. Operational parameters of the power converter may be determined as a result of data collected during monitoring. A grid code for the power grid to which the power converter is to be connected may be received subsequent to the collecting. An operational mode of the power converter may be established, based, at least on part, on the operational parameters and the grid code. In the event the grid code and the operational parameters match, the power converter may be activated for electrical power production based on the operational mode. When the grid code and the operational parameters do not match, an error condition may be raised.

21 Claims, 7 Drawing Sheets

(56) References Cited

U.S. PATENT DOCUMENTS

| | | | | |
|---|---|---|---|---|
| 2010/0177450 | A1* | 7/2010 | Holcomb | H02H 9/023 361/19 |
| 2013/0204557 | A1* | 8/2013 | Trudnowski | H02J 13/00002 702/60 |
| 2016/0099568 | A1* | 4/2016 | Gersch | H02J 3/32 307/20 |
| 2019/0033804 | A1 | 1/2019 | Handelsman et al. | |
| 2020/0313440 | A1 | 10/2020 | Gupta et al. | |
| 2022/0337062 | A1* | 10/2022 | Alvord | G06Q 10/06312 |

OTHER PUBLICATIONS

Z. Balaton et al., "Application Monitoring in the Grid with GRM and PROVE," International Conference on Computational Science, ICCS 2001, pp. 253-262, Jan. 2001.
"Setting the Grid Profile—Mexico," Enphase Energy, Jan. 2014.
"Viewing and Setting Inverter Grid Protection Values," SolarEdge, Version 1.3, Jan. 2019.

* cited by examiner

GRID MONITORING

CROSS-REFERENCE TO RELATED APPLICATIONS

This application claims the benefit of U.S. Provisional Application No. 63/246,514, filed on Sep. 21, 2021. The entire disclosure of the foregoing application is incorporated by reference in its entirety.

BACKGROUND

Prior to activating a photovoltaic (PV) system and connecting the PV system to an electrical network (e.g., a "grid"), an installer typically causes one or more components of the PV system to monitor the output of a power converter (e.g., an inverter) in the photovoltaic system to ensure that various parameters of the power converter output match corresponding parameters of the grid. Such parameters may include voltage and current parameters (e.g. amplitude, frequency and/or phase of voltage and/or current components) of the grid.

SUMMARY

The following summary presents a simplified summary of certain features. The summary is not an extensive overview and is not intended to identify key or critical elements.

Systems, apparatus, and methods are described for monitor alternating current (AC) grids in order to compare electrical parameters of an output from a power converter in a PV system to corresponding electrical parameters of a grid.

These and other features and advantages are described in greater detail below.

BRIEF DESCRIPTION OF THE DRAWINGS

Some features are shown by way of example, and not by limitation, in the accompanying drawings. In the drawings, like numerals reference similar elements.

DETAILED DESCRIPTION

The accompanying drawings, which form a part hereof, show examples of the disclosure. It is to be understood that the examples shown in the drawings and/or discussed herein are non-exclusive and that there are other examples of how the disclosure may be practiced.

Figure 1:
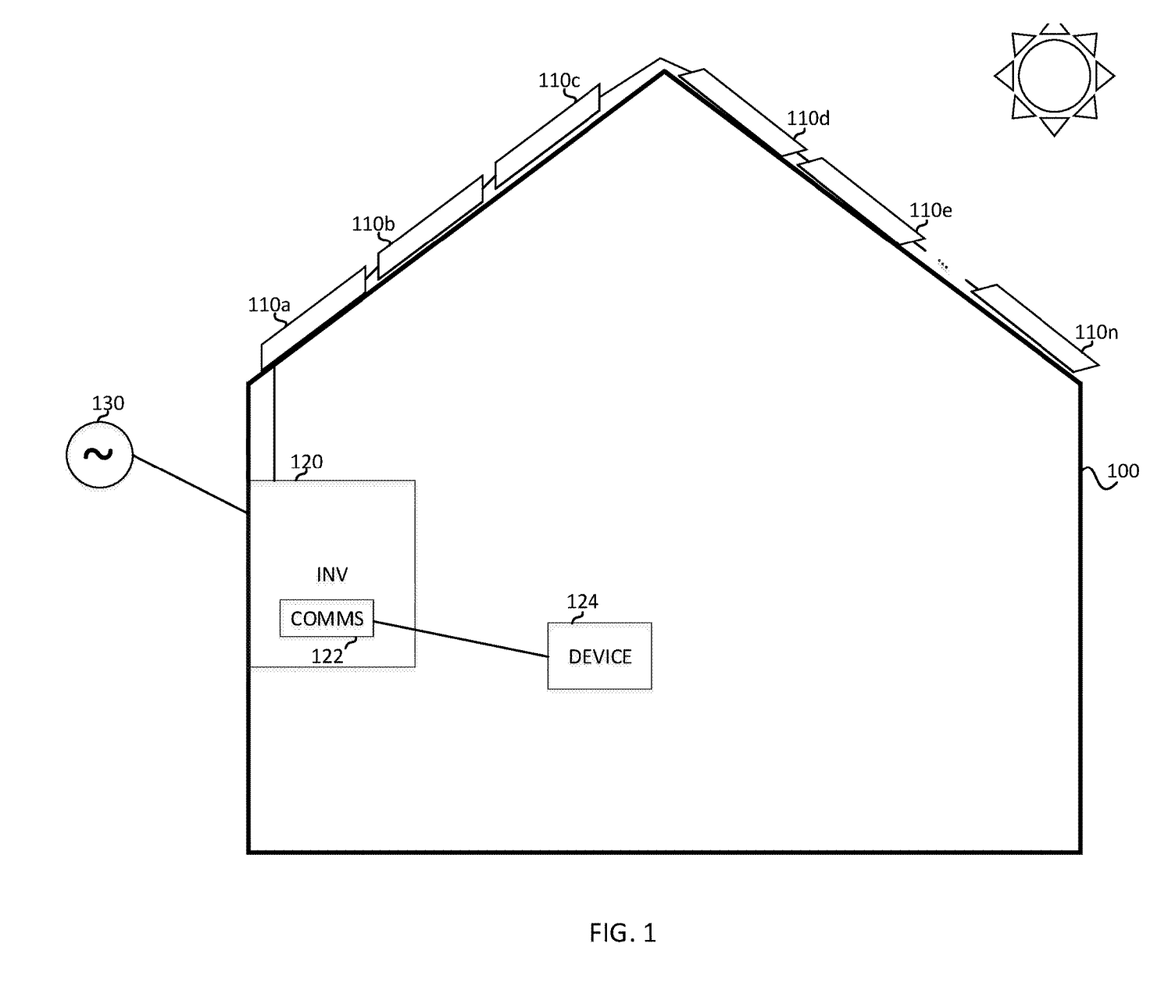
FIG. 1 shows an example home with a PV system.

Reference is now made to FIG. 1, which shows an electrical grid (e.g., alternating current (AC) grid 130). A home 100 featuring a photovoltaic (PV) system may also be depicted. The PV system may comprise a plurality of solar panels 110a, 110b, 110c . . . to 110n (or 110a-110n, where "n" designates a natural number, and not necessarily the number 14). The plurality of solar panels 110a-110n may provide direct current (DC) electricity to a power converter 120. The power converter 120 may comprise a DC-AC inverter. The AC grid 130 (sometimes referred to as an electrical grid or a power grid) may be an interconnected network for electricity delivery from producers to consumers. AC grids may vary in size and may cover whole countries or continents. In some cases, the AC grid 130 may comprise a local grid ("microgrid") For example, the local grid may be a part of a regional wide-area synchronous grid but which may disconnect and operate autonomously.

Power grids may be synchronous, meaning all distribution areas may operate with three phase AC frequencies synchronized. This may allow synchronized transmission of AC power throughout an area covered by the power grids, such as by connecting a large number of electricity generators and consumers, or by enabling more efficient electricity markets and redundant generation.

An electrical grid (e.g., the AC grid 130) may have a grid code. A grid code is a specification which may define parameters for an electric power generation facility (e.g., a 'power plant') connected to a public electrical grid. The grid code may promote safe, secure, and economic functioning of an electric system. The parameters may include various information about grid voltage, such as, but not limited to: maximum grid voltage value, minimum grid voltage value, a root mean square (RMS) voltage value, a line-to-line voltage value, a grid direct current (DC) offset voltage value, a grid frequency value, and so forth. The electric power generation facility may include, but not be limited to, by way of example, nuclear power plants, hydroelectric power plants, coal-fired power plants, gas-fired power plants, winds power plants, solar power plants, and so forth. The parameters mentioned herein are not meant to be limiting, and other appropriate parameters may be defined by the grid code.

A grid profile may be created based, at least in part, on measurements taken of a grid electrical supply (for example, by the power converter 120). The grid profile may be locally stored (e.g., on a memory device of the power converter 120) and/or stored at a remote server, for example, available to PV system installers over the Internet. The grid profile may comprise a collection of measured, calculated and/or estimated grid parameters. By way of example: Maximum Grid Voltage ($V_{gMax}$) value, Minimum Grid Voltage ($V_{gMin}$) value, Maximum Grid Frequency ($F_{gMax}$) value, Minimum Grid Frequency ($F_{gMin}$) value, a line-to-line voltage value, a grid direct current (DC) offset voltage value, and so forth. The parameters mentioned herein are not meant to be limiting, and other appropriate parameters may be included in the grid profile.

The power converter 120 may have a communications interface 122 which may enable communications with other devices, such as device 124. The communications interface 122 may be a wireless communication device, utilizing short range wireless communication protocols, for example, Bluetooth, Infrared, Near Field Communication, WiFi (Wireless Fidelity), and Zig-Bee. Device 124 may connect to the communications interface 122. Device 124 may comprise, for example, a wired device (e.g., a desktop computer), a hand held device, such as a smart phone, a tablet, a lap top computer, a dedicated device with computing power, or other appropriate device.

Figure 2:
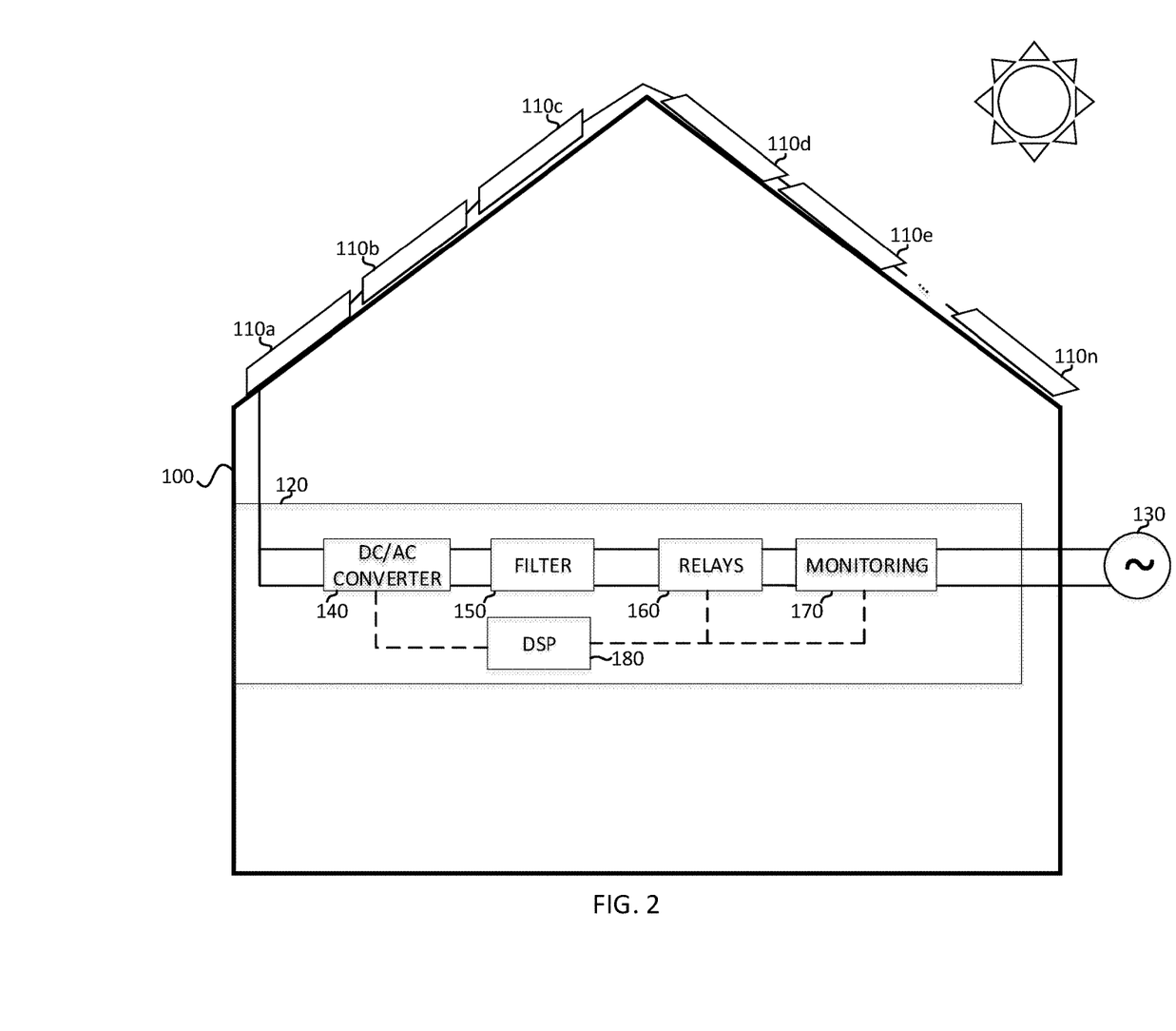
FIG. 2 shows details of the power converter in the home with the PV system of FIG. 1.

Reference is now made to FIG. 2, which shows details of the power converter 120 in the home 100 with the PV system of FIG. 1. DC electricity generated by the solar panels 110a-110n may be input into the power converter 120. A DC/AC converter 140 may convert the input DC electricity to AC electricity. The DC/AC converter 140 may comprise a single-phase DC/AC converter, three-phase DC/AC converter, or other DC/AC converter. A filter 150 may smooth output voltage and/or current signals output by DC/AC converter 140. Relays 160, which may comprise solid state relays, electro-mechanical relays, or other appropriate type of relays, may be either open or closed. The relays 160 may provide galvanic connection or isolation between the AC grid 130 and the power converter 120. When the relays 160 are closed, and power being produced by the DC/AC converter 140 may be provided to the AC grid 130. When no power is being produced by the power DC/AC converter 140, or when the relays 160 are open, then no power is provided to the AC grid 130. A monitoring module 170 may monitor various parameters of the AC grid 130, such as, $V_{gMax}$, $V_{gMin}$, $F_{gMax}$, $F_{gMin}$ values, the grid direct current (DC) offset voltage value, and so forth. The monitoring module 170 may comprise appropriate measurement instruments, for example, a voltmeter, an ammeter, frequency measurement equipment (described below), DC current sensor, and so forth. Other appropriate parameters besides those mentioned above may also be monitored by the monitoring module 170. The monitoring module 170 may comprise either or both of long term or short term memory, and other components as appropriate. For example, during islanding conditions or small isolated grids, a DC offset voltage may be present due to imperfections in a local power generation.

By way of example, a switch may be added in an electrical path in series with a resistor, wherein the switch and resistor disposed in parallel to AC terminals of the AC grid 130 between the relays 160 and the monitoring module 170. The DC current may then be measured across the resistor.

The frequency measurement equipment may comprise a peak-detection circuit, which may determine a topmost point in AC sine wave of AC current of the AC grid 130. E.g., when the peak-detection circuit detects a peak, the peak-detection circuit may start a timer which may be shut off when the next peak in the AC sine wave train is detected. The peak-detection circuit may determine the time interval between two successive crests of the AC sine wave and may calculate a frequency of the AC sine wave. An AC voltage of the AC grid 130 may be sampled at a relatively high sampling rate, and the samples may be used by the frequency measurement equipment to determine and/or estimate peaks in the AC sine wave. The peaks may be used to calculate the frequency of the AC sine wave.

A controller (e.g., a digital signal processor (DSP) 180) may receive measurements of various monitored parameters of the AC grid 130 from the monitoring module 170. The DSP 180 may control the DC/AC converter 140 based on the received parameters of the AC grid 130. For example, the parameters of the AC electricity produced by the DC/AC converter 140 may match corresponding parameters of the AC grid 130. E.g., based on the received parameters of the AC grid 130, the controller 180 may control the relays 160, such as by opening and closing the relays 160 as appropriate. For example, the relays 160 may be opened by the controller 180 after sunset when there is limited photovoltaic production from solar energy. The relays 160 may be closed by the controller 180 after sunrise when solar production increases. The controller 180 may also stop the DC/AC converter 140 from producing AC electricity after sunset when the relays 160 are open, and start the DC/AC converter 140 producing AC electricity after sunrise when the relays 160 are closed.

The monitoring module 170 may provide measurements of the various monitored parameters of the AC grid 130 from the monitoring module 170 to the controller 180. These measurements may be provided to the controller 180 before the DC/AC converter 140 is activated on an operational basis. Activating the DC/AC converter 140 may include closing the relays 160. Prior to closing the relays 160, the controller 180 may determine operational parameters of the DC/AC converter 140 based, at least in part, on the received measurements of the AC grid 130 from the monitoring module 170.

Figure 3A:
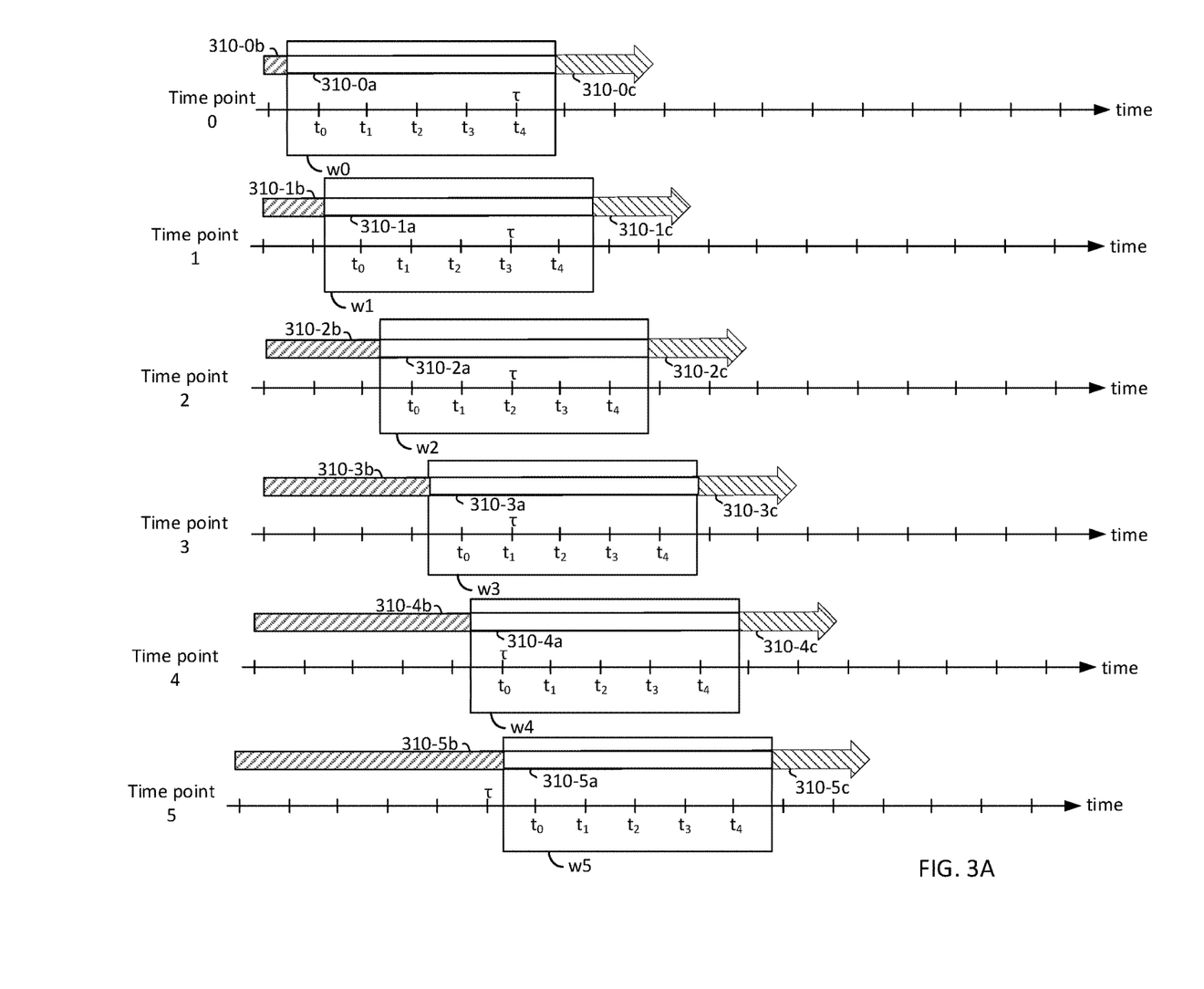
FIG. 3A shows an example of a sliding window on a time line.

Reference is now made to FIG. 3A, which shows an example of a sliding window (e.g., w0) on a time line (e.g., a first time line shown for time point 0). For collecting the grid parameters of the grid profile, the various monitored parameters may be measured at a single time or over a period of time (e.g., a sliding window). The measurements over a sliding window may be stored in a memory of a device with computing power. For example, a block of memory of a substantially fixed size may be allocated to store the measurements. Once the allocated memory block is full, new measurements may replace the oldest measurements stored in the memory block. By way of example, with reference to FIG. 3A, the measurements over the sliding window may be stored in the memory, where the sliding window has, for example, a 30 second length, a 60 second length, a 300 second length or a 600 second length. As an example, in FIG. 3A, the sliding window shows a five second length (e.g., $t_0$-$t_4$). The measurements may be stored, for example, in a log file. The sliding window may operate on a first-in-first-out basis. For example, when the sliding winding has a 60 second length, a first set of measurements may be taken at time $t_0$, which may be at the start of the 60 seconds. Measurements may then be taken at appropriate intervals, e.g., 20, 50 or 100 microseconds, or as near to continuously as is practical. For ease of discussion, the present example is, by way of example only, based on one measurement every second.

The example depicted in FIG. 3A is provided as a non-limiting example. As mentioned above, the sliding window of FIG. 3A is shown as a 5 second sliding window. On a first time line shown for time point 0, sliding window w0 in the memory may include measurements taken at times marked as $t_0$-$t_4$. As a reference point, the time indicated as $t_4$ in the sliding window w0 may also be indicated with the Greek letter τ (tau). Throughout the example of FIG. 3A, the reference point τ may remain in a fixed location. Designations of other elements in the example may change as the example progresses, including the designation(s) of the point on the time line where the reference point τ itself is located. An arrow 310-0/310-1/310-2/310-3/310-4/310-5 (collectively referred to herein as arrow 310) may indicate a direction in which the sliding window w0 is progressing. More specifically the arrow 310 is divided into three portions, a first portion 310-0a/310-1a/310-2a/310-3a/310-4a/310-5a (collectively referred to herein as first portion 310a), a second portion 310-0b/310-1b/310-2b/310-3b/310-4b/310-5b (collectively referred to herein as second portion 310b), and a third portion 310-0c/310-1c/310-2c/310-3c/310-4c/310-5c (collectively referred to herein as third portion 310c). The first portion 310a of the arrow 310 indicates a block of time within the sliding window w0. The second portion 310b of the arrow 310 is outside and to the left of the sliding window w0. The second portion 310b of the arrow 310 may indicate 'the past', or in other words, time prior to the sliding window. The third portion of the arrow 310c is outside and to the right of the sliding window w0. The third portion of the arrow 310c may indicate 'the future', or in other words, time after the sliding window. (Note that the explanation of the portions of arrow 310 are not repeated below, in the interest of brevity.) A block of memory may be designated in the computing device for storing the measurements. As more measurements are taken at a later time, the sliding window w0 may have progressed, and earlier measurements may be overwritten by later measurements. For the purposes of this discussion, the present time, at any given moment, may be indicated by $t_4$.

A second time line is shown for time point 1. The sliding window, now denoted as w1, may have progressed in time along the direction of the arrow 310. The measurements taken at time $t_0$ at time point 0 in the sliding window w0 may now be outside the sliding window w1, and accordingly, may no longer be in the memory (e.g., the measurements taken at time to at time point 0 may no longer be stored, but may be over written with new measurements). The second time line of time point 1 may show the time that $t_1$ on the first time line of time point 0 is now denoted as time to in the sliding window w1. Time $t_3$ in sliding window w1 may now be at the reference point τ.

A third time line is shown for time point 2. The sliding window, now denoted as w2, may have progressed in time in the direction of the arrow 310. The measurements taken at time to at time point 1 in the sliding window w1 may now be outside the sliding window w2, and accordingly, may no longer be in the memory (e.g., the measurements taken at to and $t_1$ at time point 0 and at to at time point 1 may no longer be stored, but may be overwritten with new measurements). The third time line of time point 2 may show the time that $t_1$ on the second time line of time point 1 is now denoted as time to in the sliding window w2. Time $t_2$ in sliding window w2 may now be at the reference point τ.

A fourth time line is shown for time point 3. The sliding window, now denoted as w3, may have progressed in time in the direction of the arrow 310. The measurements taken at time to at time point 2 in the sliding window w2 may now be outside the sliding window w3, and accordingly, may no longer be in the memory (e.g., the measurements taken at $t_0$, $t_1$ and $t_2$ at time point 0, at to and at $t_1$ at time point 1, and at to at time point 2 may no longer be stored, but may be overwritten with new measurements). The fourth time line of time point 3 may show the time that $t_1$ on the third time line of time point 2 is now denoted as time to in the sliding window w3. Time $t_1$ in sliding window w3 may now be at the reference point τ.

A fifth time line is shown for time point 4. The sliding window, now denoted as w4, may have progressed in time in the direction of the arrow 310. The measurements taken at time to at time point 3 in the sliding window w3 may now be outside the sliding window w4, and accordingly, may no longer be in the memory (e.g., the measurements taken at $t_0$, $t_1$, $t_2$, and $t_3$ at time point 0, at $t_0$, $t_1$, and $t_2$ time point 1, at $t_0$, and $t_1$ at time point 2, and at to at time point 3 may no longer be stored, but may be overwritten with new measurements). The fifth time line of time point 4 may show the time that $t_1$ on the fourth time line of time point 3 is now denoted as time to in the sliding window w4. Time to in sliding window w4 may now be at the reference point τ.

A sixth time line is shown for time point 5. The sliding window, now denoted as w5, may have progressed in time in the direction of the arrow 310. The measurements taken at time to at time point 4 in the sliding window w4 may now be outside the sliding window w5, and accordingly, are no longer in the memory (e.g., the measurements taken at $t_0$, $t_1$, $t_2$, $t_3$, and $t_4$ at time point 0, at $t_0$, $t_1$, $t_2$, and $t_3$ time point 1, at $t_0$, $t_1$, and $t_2$ at time point 2, at to and $t_1$ at time point 3, and at to at time point 4 may no longer be stored, but may be overwritten with new measurements). The sixth time line of time point 5 shows that the time that $t_1$ on the fifth time line of time point 4 may now be denoted as time to in the sliding window w5. The reference point τ may no longer be in sliding window w5.

For contents of any given set of measurements stored in a sliding window in a memory block, the various parameters may be calculated. By way of example, $V_{gMax}$, $V_{gMin}$, $F_{gMax}$, or $F_{gMin}$ may be calculated. For example, for one set of measurements stored in a sliding window (e.g., w0), $V_{gMax}$ may be determined to be 261V, $V_{gMin}$ may be determined to be 187V, $F_{gMax}$ may be determined to be 50.1 Hz, $F_{gMin}$ may be determined to be 49.9 Hz. For another set of measurements stored in a sliding window (e.g., w1), $V_{gMax}$ may be determined to be 250V, $V_{gMin}$ may be determined to be 103V, $F_{gMax}$ may be determined to be 50.2 Hz, $F_{gMin}$ may be determined to be 49.6 Hz.

The various measurements described above may be taken together to form/establish a grid profile. For any given grid profile, a calculation may be performed to determine, based on at least voltage measurements, a grid profile voltage amplitude, a grid profile frequency, or a grid profile DC voltage of an electrical grid (e.g., the AC grid 130).

During installation, the power converter 120 may activate, (or be activated via an interface by an installer, for example) a monitoring mode of operation. During the monitoring mode of operation, power converter 120 may monitor various grid parameters for a grid profile. After an amount of time, which may be determined, at least in part, by local regulatory codes (e.g., 60 seconds, 5 minutes, 8 minutes, etc.), the power converter 120 may, based on measurements of grid parameters, obtain a grid profile, (e.g., subsequent to the monitoring the various grid parameters, or subsequent to the determining operational parameters of the power converter 120 based on the monitoring).

The power converter 120 may then be provided with a configuration, based, at least in part, on an appropriate grid code, via a user interface. For example, the configuration may be selected to be appropriate to the AC grid 130 to which the power converter 120 is being connected. By way of example, a power converter 120 installed in New York State may be provided a configuration appropriate for the Eastern US power grid. A power converter 120 installed in London, UK, may be provided with a configuration for the English and Welsh National Grid, and so forth. The user interface may be, for example, an interface mounted on the power converter 120, or a hand held device, such as a smart phone, a tablet, a lap top computer, or a dedicated device with computing power.

The power converter 120 may compare a configuration with which it was provided to a first grid profile and the first grid profile. Responsive to a positive match between the configuration and the first grid profile, the power converter 120 may then enter a production mode of operation. In the production mode of operation, the power converter 120 may produce AC electricity, which may be provided to the AC grid 130. In the event of a mismatch between the configuration and the first grid profile, the power converter 120 may abstain from producing AC electricity to be provided to the AC grid 130, and may enter a mismatch mode of operation.

In some instances, such as when the power converter 120 enters the mismatch mode of operation, the power converter 120 may create a second grid profile. The second grid profile may be created in the same manner as the first grid profile. The power converter 120 may monitor operation of the AC grid 130 for the amount of time, and may store the various grid parameters in a memory block, such as in a sliding window (e.g., w0), as in FIG. 3A. The second grid profile may then be compared to the configuration with which it was provided to the first grid profile. When the second grid profile matches the configuration, the power converter 120 may then enter the production mode of operation. When, however, the mismatch persists, a warning may be sent, for example, to the installer, or to a server, or to a supervisor, etc., via text message, via email, or via another appropriate medium. In some instances, the warning may be a lit LED (light emitting diode) on a warning panel or a buzzer which sounds. For example, the installer may have a hand held device, such as, for example, a smart phone, a tablet, a lap top computer, a dedicated device with computing power, or other appropriate device. The installer's hand held device may comprise device 124 of FIG. 1.

A match may be evaluated between a configuration with which it was provided to a grid profile and the grid profile (such as, the first grid profile and/or the second grid profile) based on at least one of: comparing a grid profile voltage amplitude to a configuration voltage amplitude, comparing a grid profile frequency to a configuration frequency, or comparing a grid profile DC voltage to a configuration DC voltage. A match may result from one or more comparisons in which the compared profile and configuration (or parameters thereof) are found to be equal. A match may result from one or more comparisons in which the compared profile and configuration (or parameters thereof) are found to be equal or within an appropriate margin of error or tolerance. When there is a match, a positive indication may be provided. For example, "Match" may appear on an interface display, a green LED may light up, or a text message may be sent to an installer or a supervisor indicating that there is a match, or some combination of all of the above. When there is no match, then a negative indication may be provided. For example, "Not A Match" may appear on an interface display, a red LED may light up, or a text message may be sent to an installer or a supervisor indicating that there is a match, or some combination of all of the above. Other appropriate methods of indicating that there is a match or that there is no match may also be utilized.

In some instances, an estimated (or predicted) grid profile may be obtained based on a Global Positioning Satellite (GPS) signal. For example, the installer may operate a GPS (on a smart phone or tablet, such as device 124 of FIG. 1 for example, or on power converter 120), which may determine a location where the installer is performing the installation. Based on the determined location, a grid profile may be predicted. For example, when the installer is in London, UK, then the grid profile predicted based on a GPS signal may comprise grid parameters of the English and Welsh National Grid. In such a case, the estimated grid profile may appear in an appropriate field of the user interface. In some cases (for example, where more than one grid profiles may be suitable based on a location indicated by a GPS signal) a limited number of possible estimated grid profiles may appear in the appropriate field of the user interface based on a GPS signal. An option to expand the possible estimated grid profiles may also be provided, so that when an estimated grid profile provided in the user interface is incorrect, an installer may locate and select a correct grid profile from the possible estimated grid profiles.

In some instances, when operational parameters of the power converter 120 do not match (within an appropriate margin of error or tolerance) an expected set of operational parameters based on the estimated (or predicted) grid profile, the user interface may provide an appropriate warning to the installer. The installer may then take an appropriate step, which may include, but not be limited to overriding the user interface, determining a presence of a problem with the AC grid 130, which leads to the warning message, determine when a problem resolves with an installation or an installed photovoltaic system, or another appropriate action.

In some instances, a power grid at an output of the power converter 120 may be monitored, for example, by the power converter 120, in order to determine, based on the monitoring, operational parameters of the power converter 120. The monitoring may be performed for a set amount of time, e.g., 60 seconds, 300 seconds, 480 seconds, etc. The set amount of time might be set based on a grid code or legal requirements, or may exceed such requirements. The power converter 120 may be activated, e.g., connected in a production mode to the AC grid 130 when the monitoring indicates that the power converter 120 is producing power according to the operational parameters and the grid code. Activation of the power converter 120 may entail comparing the grid code to operational parameters of the power converter 120. When the comparing indicates that the grid code and the operational parameters of the power converter 120 match then the power converter 120 may be activated, and may enter a production mode. The match may be within a certain tolerance. The tolerance may be determined on a per jurisdiction basis, as may be defined in relevant laws and electrical codes. By way of example (as may be consistent with example values above, such as when $V_{gMax}$ may be determined to be 261V), when an local electrical code states that $V_{gMax}$ should not exceed 260V, an allowance of, for example, +5 V may be allowed for instrumentation and calibration errors.

When the comparing the grid code to operational parameters of the power converter 120 does not produce a match, the power converter 120 may then raise an alert. Raising an alert may entail, for example, displaying a warning on an appropriate display, lighting a red LED on an installer's device (e.g., device 124 of FIG. 1), sending a text message to an installer or a supervisor indicating that there is an alert, or some combination of the above.

As noted above, a monitoring mode may entail the power converter 120 performing a plurality of grid measurements. At least one of the grid measurements may be saved to a memory device, or the plurality of grid measurements may be saved to the memory device. As mentioned above, a sliding window (e.g., w0) of measurements may be stored in a memory block, such as the sliding window having a 60 second length or the sliding window having a 300 second length. The measurements may be stored, for example, in a log file. The sliding window may operate on a first-in-first-out basis.

The grid measurements may include voltage measurements, frequency measurements, measurements of a direct current (DC) offset voltage value, and so forth, as detailed above. The grid measurements may include amplitude measurements.

When there is a positive match between a configuration and a grid profile, the power converter 120 may enter a production mode, and begin providing electric power to the AC grid 130. When there is a positive match the grid profile and a predicted grid profile, the power converter 120 may enter a production mode, and begin providing electric power to the AC grid 130. When there is a positive match between the configuration and the grid profile and a positive match between the grid profile and the predicted grid profile, the power converter 120 may enter a production mode, and begin providing electric power to the AC grid 130.

Figure 3B:
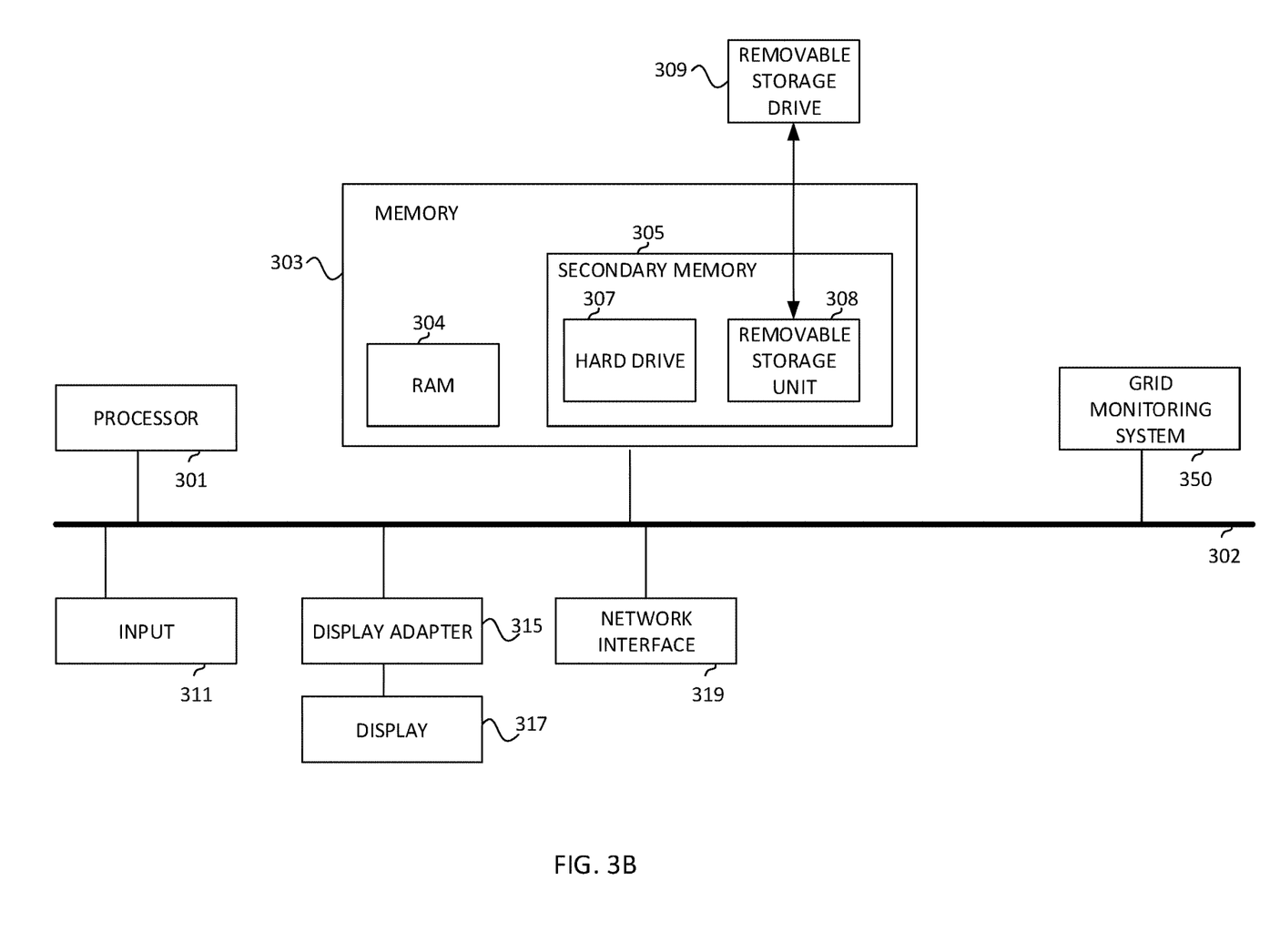
FIG. 3B shows an example block diagram of a device, such as the device of FIG. 1.

FIG. 3B shows an example block diagram of a device 124, such as the device 124 of FIG. 1. The device 124 may be suitable for implementing any grid monitoring systems (e.g., grid monitoring system 350), methods or processes described herein. The device 124 may comprise one or more processors, such as processor 301, providing an execution platform for executing machine-readable instructions such as software. One of the one or more processors may be a special purpose processor operative for executing operations of the grid monitoring system 350 as described herein.

Commands and data from the processor 301 may be communicated over a communication bus 302. The device 124 may include a main memory 303, such as a Random Access Memory (RAM) 304, where machine readable instructions may reside during runtime, and a secondary memory 305. The secondary memory 305 may include, for example, a hard disk drive 307 and/or a removable storage unit 308 (which may be not generally accessible on a regular basis, but possibly accessible by service personnel or installers, etc.), such as a floppy diskette drive, a magnetic tape drive, a compact disk drive, a flash drive, etc., or a non-volatile memory where a copy of the machine readable instructions or software may be stored. The secondary memory 305 may also include ROM (read only memory), EPROM (erasable, programmable ROM), or EEPROM (electrically erasable, programmable ROM). In addition to software, data relevant to operations of a smart energy home, such as various historical data regarding past operations of the device 124 as described herein above, or other similar data may be stored in the main memory 303 or the secondary memory 305. The removable storage unit 308 may read from or write to a removable storage drive 309.

A user may interface with the device 124 via a user interface which includes input devices 311, such as a touch screen, a keyboard, a mouse, a stylus, and the like, as well as interfaces for input via a wireless interface, in order to provide user input data or other commands. A display adaptor 315 may interface with the communication bus 302 and a display 317 and may receive display data from the processor 301 and may convert the display data into display commands for the display 317.

A network interface 319 is provided for communicating with other systems and other devices via a network. The device 124 may communicate with the power converter 120 via communications interface 122, which may be the network interface 319, for example. The network interface 319 may include a wireless interface for communicating with wireless devices. A wired network interface (an Ethernet interface, by way of example) may be present as well. The device 124 may also comprise other interfaces, including, but not limited to Bluetooth or HDMI.

The installer may interact with the device 124 via the input devices 311 and the display 317.

It is appreciated that one or more of the above-described components of the power converter 120 and the device 124 included or described herein, or other components may be added. The device 124 shown in FIG. 3B is provided as an example of a possible platform that may be used, and other appropriate types of platforms may be used as alternative platforms.

Figure 4:
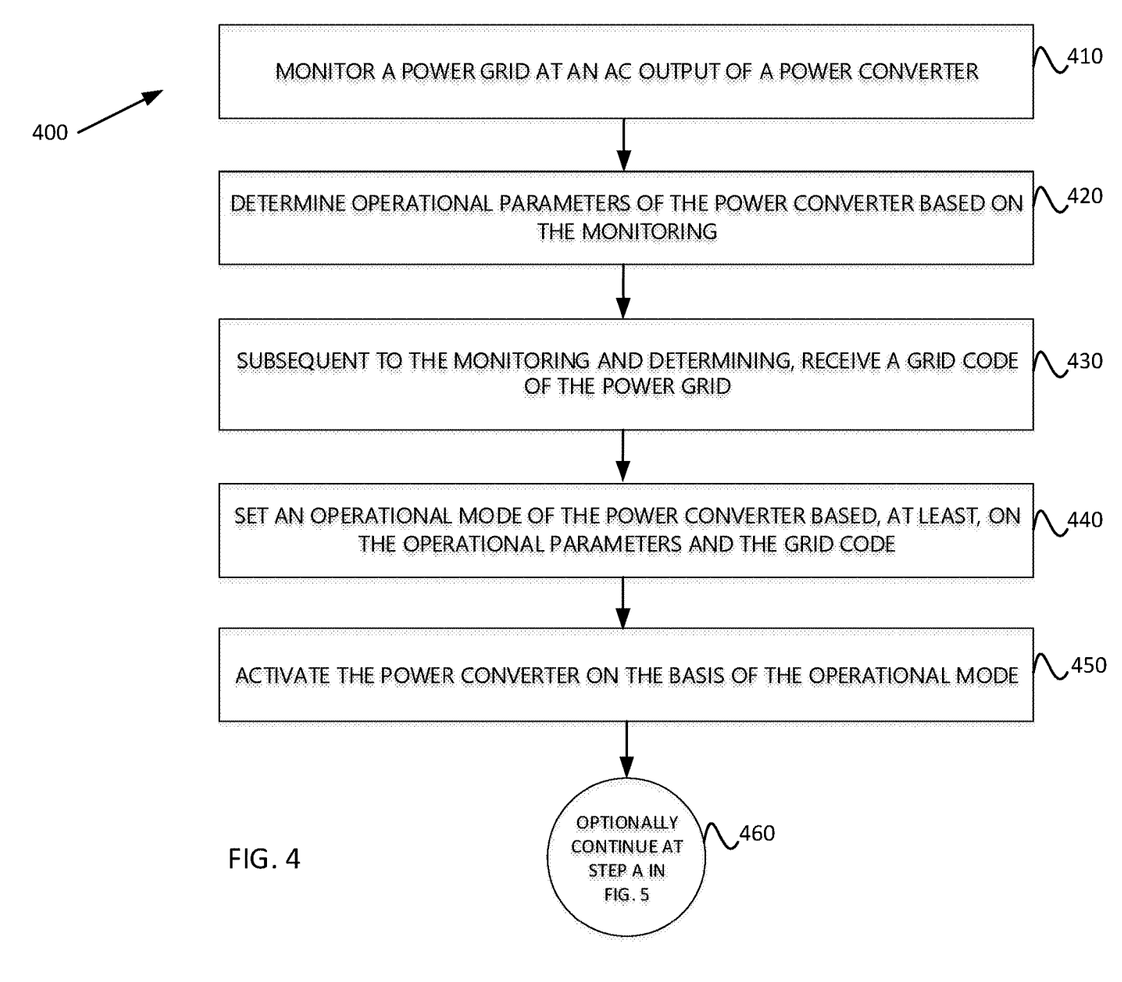
FIG. 4 is a flow chart showing an example method for grid monitoring.

Reference is now made to FIG. 4, which is a flow chart 400 showing an exemplary method for grid monitoring. At step 410, the AC grid 130 may be monitored by the power converter 120 for various grid parameters at the output of the power converter 120 to the AC grid 130. The various parameters may include the parameters mentioned above, such as, but not limited to $V_{gMax}$, $V_{gMin}$, $F_{gMax}$, $F_{gMin}$ values, a line-to-line voltage value, a grid DC offset voltage value, and so forth. At step 420, operational parameters of the power converter 120 may be determined (e.g., calculated) based, at least in part, on the monitoring. At step 430, a grid code of the AC grid 130 may be received subsequent to the monitoring and determining, as described above. At step 440, an operational mode of the power converter 120 may be set. The operational mode may be set, based, at least in part, on the operational parameters and the grid code. At step 450, the power converter 120 may be activated (e.g., set to provide AC electricity to the AC grid 130 based on the operational mode). At step 460, an operation may optionally continue with step A of FIG. 5, as described below.

Figure 5:
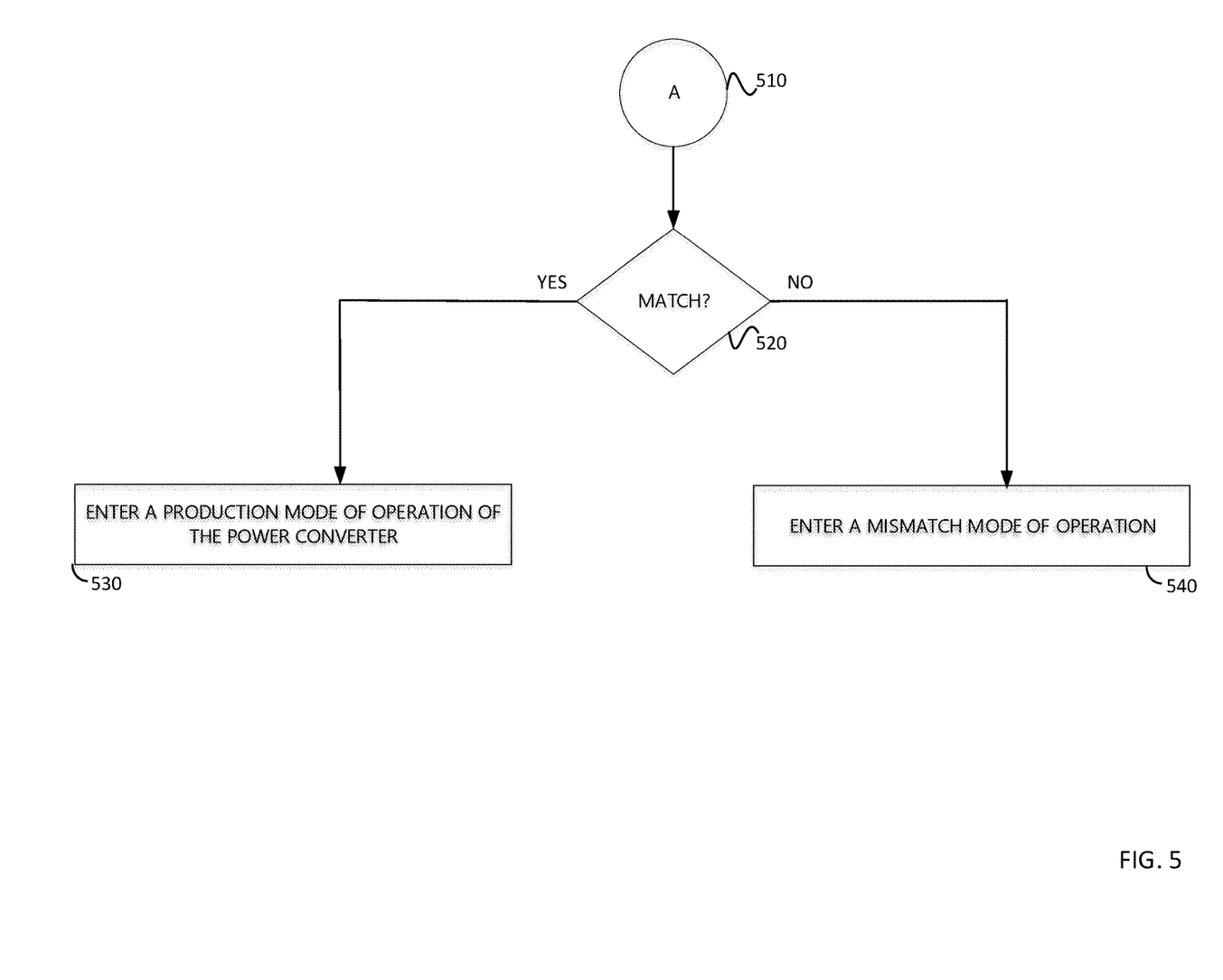
FIG. 5 is a flow chart showing an example method for determining a parameter match based on grid monitoring.

Reference is now made to FIG. 5, which is a flow chart showing an example method for determining a parameter match based on the grid monitoring. At step 510 A, operation may continue from step 460 in FIG. 4. At step 520, a match may be evaluated between the operational parameters of the power converter 120 and the grid code of the AC grid 130. When a match exists, then the method may proceed to step 530, and the power converter 120 may enter a production mode of operation.

At step 540, when a match is not found, then the power converter 120 may enter a mismatch mode of operation. In the mismatch mode of operation, a warning may be sent, for example, to the installer (e.g., via device 124 of FIG. 1), to a server, or to a supervisor, etc., via text message, via email, or via another appropriate medium. In some instances, the warning may be a lit LED (light emitting diode) on a warning panel or a buzzer which may sound, as described above. In response to the entering of a mismatch mode of operation in step 540, the installer may then override the user interface, and cause the power converter 120 to enter the production mode of operation. In another response to the entering of a mismatch mode of operation in step 540, the installer may determine a presence of a problem with the AC grid 130 which leads to the warning message. In still another response to the entering of a mismatch mode of operation in step 540, the installer may note that a problem exists with the installation or the installed photovoltaic system, and take appropriate action based on the problem. In yet another response to the entering of a mismatch mode of operation in step 540, the installer may take another appropriate response, which may depend on the nature of the cause of entering the mismatch mode of operation.

Figure 6:
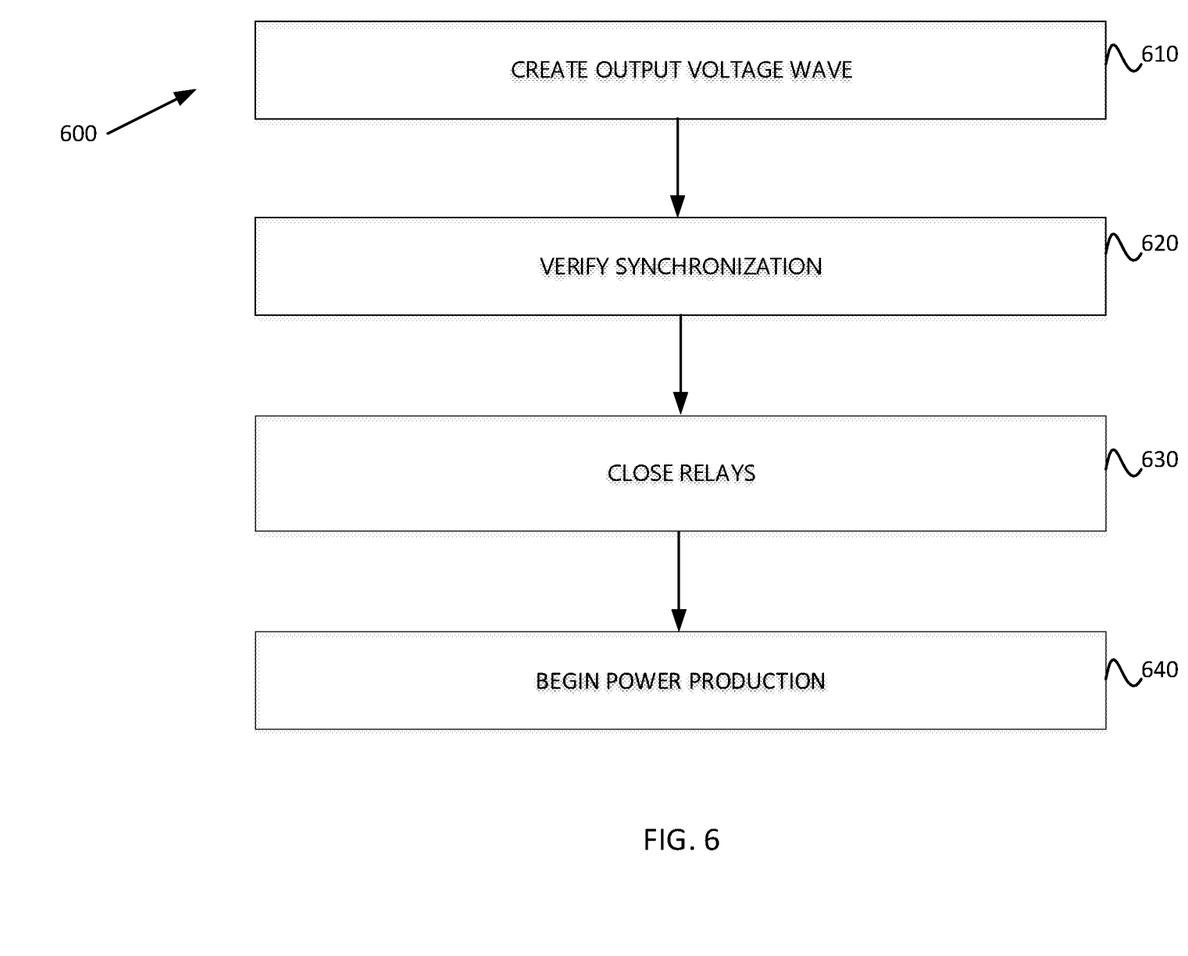
FIG. 6 is a flow chart showing an example method for operation of a power converter.

Reference is now made to FIG. 6, which is a flow chart showing an example method for operation of a power converter, such as the power converter 120, described above. At step 610, the power converter 120 may begin to create an output voltage wave. The output voltage wave may, for example, comprise an AC voltage sine wave. At step 620, the power converter 120 may verify synchronization between parameters of an output voltage wave of the power converter 120 (e.g., $V_{gMax}$, $V_{gMin}$, $F_{gMax}$, $F_{gMin}$ values, the grid direct current (DC) offset voltage value, and so forth, as described above) and those of the AC grid 130. An example method for grid monitoring to verify synchronization between the parameters of the output voltage wave of the power converter 120 and those of the AC grid 130 may be provided in FIG. 4. At step 630, the relays 160 may be closed. At step 640 the power converter 120 may begin power production. Power produced by the power converter 120 may then be provided to the AC grid 130.

One or more of the steps described above may be implemented as instructions embedded on a non-volatile computer readable medium and executed remotely. The steps may be embodied by a computer program, which may exist in a variety of forms both active and inactive. For example, they may exist as software program(s) comprised of program instructions in source code, object code, executable code or other formats for performing some of the steps. Any of the above may be embodied on a computer readable medium, which include storage devices and signals, in compressed or uncompressed form. Examples of suitable computer readable storage devices include conventional computer system RAM (random access memory), ROM (read only memory), EPROM (erasable, programmable ROM), EEPROM (electrically erasable, programmable ROM), or magnetic or optical disks or tapes. Examples of computer readable signals, whether modulated using a carrier or not, are signals that a computer system hosting or running a computer program may be configured to access, including signals downloaded through the Internet or other networks. Concrete examples of the foregoing include distribution of the programs on a CD ROM, on a flash drive, or via Internet download. In a sense, the Internet itself, as an abstract entity, is a computer readable medium. The same is true of computer networks in general. It is therefore to be understood that those functions enumerated above may be performed by any electronic device capable of executing the above-described functions.

Although examples are described above, all features and/or steps of those examples may be combined, divided, omitted, rearranged, revised, and/or augmented in any desired manner. Various alterations, modifications, and improvements will readily occur to those skilled in the art. Such alterations, modifications, and improvements are intended to be part of this description, though not expressly stated herein, and are intended to be within the spirit and scope of the descriptions herein. Accordingly, the foregoing description is by way of example only, and is not limiting.

The skilled person will appreciate that inventive aspects disclosed herein include a method or system as in any of the following clauses:

CLAUSES

1. A method comprising configuring a power converter for connection to an electrical grid, configuring a monitoring mode of operation of the power converter, detecting a connection of the power converter to the alternating current (AC) grid, activating the monitoring mode of operation of the power converter, selecting a configuration of the power converter according to a grid code corresponding to the AC grid.
2. The method of clause 1 and further comprising obtaining a grid profile created by the power converter, and evaluating a match between the configuration and the grid profile.
3. The method of clause 1 or clause 2, further comprising responsive to a positive match between the configuration and the grid profile, entering a production mode of operation of the power converter, responsive to a mismatch between the configuration and the grid profile, entering a mismatch mode of operation.
4. The method of clause 3 wherein the entering the mismatch mode of operation comprises creating, by the power converter, a second grid profile, and comparing the second grid profile to the configuration.
5. The method of clause 3, wherein the entering the mismatch mode of operation comprises raising a warning.
6. The method of any of clauses 1-5, wherein activating the monitoring mode comprises causing measuring, by the power converter, a plurality of grid measurements.
7. The method of clause 6, wherein measuring the grid measurements comprise measuring voltage measurements.
8. The method of clause 7, further comprising logging, by saving to a memory device, the voltage measurements.
9. The method of clause 7, further comprising retaining at least 60 seconds' worth of voltage measurements.
10 The method of clause 9, further comprising retaining at least 300 seconds' worth of voltage measurements.
11. The method of any of clauses 7-10, further comprising logging the voltage measurements according to a sliding window method.
12. The method of any of clauses 7-11, wherein the sliding window method comprising discarding voltage measurements according to a first-in-first-out rule.
13. The method of any of clauses 7-12, further comprising calculating, based on the voltage measurements, a maximum grid voltage value.
14. The method of any of clauses 7-13, further comprising calculating, based on the voltage measurements, a minimum grid voltage value.
15. The method of any of clauses 7-14, further comprising calculating, based on the voltage measurements, a root mean square (RMS) voltage value.
16. The method of any of clauses 7-16, further comprising calculating, based on the voltage measurements, a grid direct current (DC) offset voltage value.
17. The method of any of clauses 7-17, further comprising calculating, based on the voltage measurements, a grid frequency value.
18. The method of any of clauses 7-18, further comprising creating a grid profile based on the voltage measurements.
19. The method of clause 18, wherein creating a grid profile comprises calculating, based on the voltage measurements, at least one of a grid profile voltage amplitude, a grid profile frequency, and a grid profile DC voltage.
20. The method of either of clauses 18 and 19, wherein evaluating a match between the configuration and the grid profile comprises obtaining a comparison result by at least one of comparing a grid profile voltage amplitude to a configuration voltage amplitude, comparing a grid profile frequency to a configuration frequency, and comparing a grid profile DC voltage to a configuration DC voltage, and further comprising providing a positive match indication in response to the comparison result being positive and providing a mismatch indication in response to the comparison result being negative.
21. The method of any of clauses 1-20, further comprising obtaining an estimated grid profile based on a Global Positioning Satellite (GPS) signal, and comparing the grid profile to a predicted grid profile.
22. The method of clause 21, further comprising, responsive to a positive match between the configuration and the grid profile and a positive match between the grid profile and the predicted grid profile, entering a production mode of operation of the power converter.
23. The method of clause 6, wherein the grid measurements comprise frequency measurements.
24. The method of clause 23, wherein the frequency measurements comprise a measurement of a maximum frequency over a range of time.

25. The method of either of clause 23 or clause 24, wherein the frequency measurements comprise a measurement of a minimum frequency over a range of time.
26 The method of clause 6, wherein the grid measurements comprise amplitude measurements.
27. The method of clause 26, wherein the amplitude measurements comprise a measurement of a maximum frequency over a range of time.
28. The method of either clause 26 or clause 27, wherein the amplitude measurements comprise a measurement of a minimum frequency over a range of time.
29. The method of any of clauses 23-28, further comprising retaining at least 60 seconds' worth of frequency and amplitude measurements.
30 The method of clauses any of 23-29, further comprising retaining at least 300 seconds' worth of frequency and amplitude measurements.
31. The method of any of clauses 23-30 further comprising logging the voltage measurements according to a sliding window method.
32. The method of any of clauses 29-31, wherein the sliding window method comprising discarding voltage measurements according to a first-in-first-out rule.
33. A method comprising monitoring a power grid at an output of a power converter, determining operational parameters of the power converter based on the monitoring, subsequent to the monitoring and determining, receiving a grid code of the power grid, setting an operational mode of the power converter based, at least, on the operational parameters and the grid code, and activating the power converter based on the operational mode.
34. The method of clause 33, further comprising comparing the grid code to the operational parameters of the power converter, and wherein the step of activating is executed when the comparing indicates that the operational parameters are compliant with the grid code.
35. The method of either clause 33 or clause 34, further comprising providing an alert when the comparing does not produce a match.
36 The method of any of clauses 33-35, wherein the monitoring mode comprises measuring, by the power converter, a plurality of grid measurements.
37. The method of clause 36, further comprising logging, by saving to a memory device, at least one of the plurality of grid measurements.
38. The method of clauses 37, further comprising saving at least 60 seconds worth of grid measurements to the memory device.
39. The method of clause 37, further comprising saving at least 300 seconds worth of grid measurements to the memory device.
40 The method of clause 37, further comprising saving at least 480 seconds' worth of grid measurements to the memory device.
41. The method of any of clauses 37-40, further comprising logging at least one of the grid measurements according to a sliding window method.
42. The method of clause 41, wherein the sliding window method comprising discarding voltage measurements according to a first-in-first-out rule.
43. The method of clause 36, wherein the plurality of grid measurements comprise voltage measurements.
44. The method of clause 43, further comprising calculating, based on the voltage measurements, a maximum grid voltage value.
45. The method of either of clauses 43 or 44, further comprising calculating, based on the voltage measurements, a minimum grid voltage value.
46. The method of either of clauses 43-45, further comprising calculating, based on the voltage measurements, a root mean square (RMS) voltage value.
47. The method of either of clauses 43-46, further comprising calculating, based on the voltage measurements, a line-to-line voltage value.
48. The method of either of clauses 43-47, further comprising calculating, based on the voltage measurements, a grid direct current (DC) offset voltage value.
49. The method of either of clauses 43-48, further comprising calculating, based on the voltage measurements, a grid frequency value.
50. The method of clause 36, wherein the plurality of grid measurements comprise frequency measurements.
51. The method of clause 43, further comprising calculating, based on the frequency measurements, a maximum grid frequency value.
52 The method of either of clauses 43 or 44, further comprising calculating, based on the voltage measurements, a minimum grid frequency value.
53. The method of clause 36, wherein the plurality of grid measurements comprise amplitude measurements.
54. The method of clause 53, further comprising calculating, based on the amplitude measurements, a maximum grid frequency value.
55. The method of either of clauses 53 or 54, further comprising calculating, based on the voltage measurements, a minimum grid frequency value.
56. The method of any of clauses 33-55, wherein creating a grid profile comprises calculating, based on the grid measurements, at least one of a grid profile voltage amplitude, a grid profile frequency, and a grid profile DC voltage.
57. The method of any of clauses 33-56, further comprising evaluating a match between the operational parameters and the grid code by obtaining a comparison result by at least one of comparing a grid profile voltage amplitude to a configuration voltage amplitude; comparing a grid profile frequency to a configuration frequency; and comparing a grid profile DC voltage to a configuration DC voltage.
58. The method of any of clauses 33-57, further comprising obtaining a predicted grid code based on a Global Positioning Satellite (GPS) signal, and comparing the operational parameters to the predicted grid code.
59. The method of clause 58, further comprising responsive to a positive match between the operational parameters and the predicted grid code, entering a production mode of operation of the power converter.
60. An apparatus comprising a processor configured to perform the method of any one of clauses 1-59.
61. A system comprising the apparatus of claim 60.
62. A non-volatile computer-readable media comprising processor instructions configured to perform the method of any one of clauses 1-59.

Although examples are described above, features and/or steps of those examples may be combined, divided, omitted, rearranged, revised, and/or augmented in any desired manner. Various alterations, modifications, and improvements will readily occur to those skilled in the art. Such alterations, modifications, and improvements are intended to be part of this description, though not expressly stated herein, and are intended to be within the spirit and scope of the disclosure. Accordingly, the foregoing description is by way of example only, and is not limiting.

The invention claimed is:

1. A method comprising:
monitoring a power grid at an output of a power converter;
determining operational parameters of the power converter based on the monitoring;
receiving, subsequent to the monitoring and determining, a grid code of the power grid;
setting an operational mode of the power converter based, at least, on the operational parameters and the grid code; and
activating, based on the operational mode, the power converter.

2. The method of claim 1, further comprising comparing the grid code to the operational parameters of the power converter, and wherein the activating is executed when the comparing indicates that the operational parameters are compliant with the grid code.

3. The method of claim 1, wherein the monitoring comprises obtaining, by the power converter, a plurality of grid measurements.

4. The method of claim 3, further comprising logging, by saving to a memory device, at least one of the plurality of grid measurements.

5. The method of claim 4, wherein the logging comprises logging the at least one of the plurality of grid measurements according to a sliding window method.

6. The method of claim 5, wherein the sliding window method comprises discarding voltage measurements according to a first-in-first-out rule.

7. The method of claim 3, wherein the plurality of grid measurements comprise voltage measurements.

8. The method of claim 7, further comprising calculating, based on the voltage measurements, at least one of:
a maximum grid voltage value;
a minimum grid voltage value;
a root mean square (RMS) voltage value;
a line-to-line voltage value;
a grid direct current (DC) offset voltage value; or
a grid frequency value.

9. The method of claim 3, wherein the plurality of grid measurements comprise frequency measurements.

10. The method of claim 9, further comprising calculating, based on the frequency measurements, at least one of a maximum grid frequency value or a minimum grid frequency value.

11. The method of claim 3, wherein the plurality of grid measurements comprise amplitude measurements.

12. The method of claim 11, further comprising calculating, based on the amplitude measurements, at least one of a maximum grid frequency value or a minimum grid frequency value.

13. The method of claim 3, further comprising calculating, based on at least one of the grid measurements, at least one of:
a grid profile voltage amplitude;
a grid profile frequency; or
a grid profile DC current.

14. The method of claim 1, further comprising evaluating a match between the operational parameters and the grid code by comparing a grid profile voltage amplitude to a configuration voltage amplitude.

15. The method of claim 1, further comprising evaluating a match between the operational parameters and the grid code by comparing a grid profile frequency to a configuration frequency.

16. The method of claim 1, further comprising evaluating a match between the operational parameters and the grid code by comparing a grid profile DC voltage to a configuration DC voltage.

17. The method of claim 1, further comprising:
obtaining a predicted grid code based on a Global Positioning Satellite (GPS) signal; and
comparing the operational parameters with the predicted grid code.

18. The method of claim 17, further comprising:
entering, based on the comparing the operational parameters with the predicted grid code, a production mode of operation of the power converter.

19. The method of claim 1, wherein the determining the operational parameters comprises determining, by a processor, the operational parameters.

20. The method of claim 1, wherein the setting the operational mode comprises setting, by a processor, the operational mode based on the operational parameters and the grid code.

21. The method of claim 1, wherein the grid code comprises a specification defining requirements for connecting devices to the power grid.

* * * * *